US011259439B2

United States Patent
Kaesbauer et al.

(10) Patent No.: US 11,259,439 B2
(45) Date of Patent: Feb. 22, 2022

(54) LOW-VOLTAGE SWITCHING DEVICE HAVING AN ASYMMETRICALLY GUIDED AIR FLOW-BASED COOLING SYSTEM

(71) Applicant: Siemens Aktiengesellschaft, Munich (DE)

(72) Inventors: Peter Kaesbauer, Schwandorf (DE); Norbert Reichenbach, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/764,073

(22) PCT Filed: Nov. 14, 2018

(86) PCT No.: PCT/EP2018/081151
§ 371 (c)(1),
(2) Date: May 14, 2020

(87) PCT Pub. No.: WO2019/101587
PCT Pub. Date: May 31, 2019

(65) Prior Publication Data
US 2020/0288599 A1    Sep. 10, 2020

(30) Foreign Application Priority Data
Nov. 24, 2017   (EP) .................................... 17203568

(51) Int. Cl.
*H05K 7/20*    (2006.01)
(52) U.S. Cl.
CPC ..... *H05K 7/20172* (2013.01); *H05K 7/20145* (2013.01)

(58) Field of Classification Search
CPC .............. F24F 2110/10; F24F 11/0001; H05K 7/20145; H05K 7/20909; H05K 7/20918;
(Continued)

(56) References Cited

U.S. PATENT DOCUMENTS 5,127,085 A * 6/1992 Becker ................. H02H 7/1216
318/434
10,037,062 B1 * 7/2018 Bhopte .............. H05K 7/20209
(Continued)

FOREIGN PATENT DOCUMENTS

CN    201199768 Y    2/2009
CN    201226633 Y    4/2009
(Continued)

OTHER PUBLICATIONS

PCT International Search Report dated Jan. 28, 2019 corresponding to PCT International Application No. PCT/EP2018/081151 filed Nov. 14, 2018.
(Continued)

*Primary Examiner* — Mandeep S Buttar
(74) *Attorney, Agent, or Firm* — Harness, Dickey & Pierce, P.L.C.

(57) ABSTRACT

A low-voltage switching device includes a housing in which power-electronic components are arranged in the region of ventilation of a fan. In an embodiment, the power-electronic components operate under temperature regulation by virtue of an air flow that is guided asymmetrically proceeding from the fan. Therefore, the low-voltage switching device can be operated at a nominal device current range of up to 650 A as the result of the asymmetrically guided air flow.

22 Claims, 2 Drawing Sheets

(58) Field of Classification Search
CPC ........... H05K 7/20172; H05K 7/20972; H05K 1/0203; H05K 7/20; H05K 7/20136; H05K 7/20718; H05K 7/20836; H05K 7/20945; G06F 1/20; G06F 1/206
USPC .............................. 361/694, 695; 165/104.33
See application file for complete search history.

(56) References Cited

U.S. PATENT DOCUMENTS

| | | |
|---|---|---|
| 2007/0030651 A1 | 2/2007 | Vartiainen |
| 2007/0159861 A1 | 7/2007 | Meier et al. |
| 2008/0144279 A1 | 6/2008 | Yamamoto et al. |
| 2008/0180886 A1 | 7/2008 | Dornauer et al. |
| 2009/0116189 A1 | 5/2009 | Chang et al. |
| 2010/0232106 A1* | 9/2010 | Kauranen .......... H05K 7/20918 361/692 |
| 2012/0014062 A1* | 1/2012 | Siracki ............... H05K 7/20145 361/692 |
| 2014/0063739 A1 | 3/2014 | Liu et al. |

FOREIGN PATENT DOCUMENTS

| | | | |
|---|---|---|---|
| CN | 203675519 U | * | 6/2014 |
| CN | 204155194 U | | 2/2015 |
| CN | 104519717 A | | 4/2015 |
| CN | 204928554 U | | 12/2015 |
| CN | 205921262 U | | 2/2017 |
| CN | 206111673 U | | 4/2017 |
| CN | 206559805 U | | 10/2017 |
| CN | 107453268 A | | 12/2017 |
| DE | 102004017292 A1 | | 10/2005 |
| DE | 102007057472 A1 | | 6/2008 |
| EP | 1947920 A2 | | 7/2008 |
| EP | 2229044 A2 | | 9/2010 |
| EP | 2704546 A3 | | 10/2017 |

OTHER PUBLICATIONS

Written Opinion of International Searching Authority dated Jan. 28, 2019 corresponding to PCT International Application No. PCT/EP2018/081151 filed Nov. 14, 2018.

Office Action for Chinese Patent Application No. 201880075697.5 dated Jun. 11, 2021.

* cited by examiner

LOW-VOLTAGE SWITCHING DEVICE HAVING AN ASYMMETRICALLY GUIDED AIR FLOW-BASED COOLING SYSTEM

PRIORITY STATEMENT

This application is the national phase under 35 U.S.C. § 371 of PCT International Application No. PCT/EP2018/081151 which has an International filing date of Nov. 14, 2018, which designated the United States of America, and which claims priority to European patent application no. EP17203568.5 filed Nov. 24, 2017, the entire contents of each of which are hereby incorporated herein by reference.

FIELD

Embodiments of the present application generally relate to a low-voltage switching device comprising a housing in which power electronic components are arranged in the region of ventilation of a fan.

BACKGROUND

In multi-phase power networks, these are three-phase in the vast majority, power electronic devices such as soft starters are used to control the power flow. For this purpose there are power electronic units, also called power modules, in each network phase, which influence the power flow suitably. In soft starters a power module comprises two power electronic components, these are thyristors connected in anti-parallel, which are provided with cooling devices such as heat sinks.

The cooling devices are needed to lead the thermal losses which are produced by the power control in the power electronic components away from the same and therefore to avoid impermissible temperatures in the components.

A further cooling device(s) is/are fans for improving the dissipation of heat from heat sinks. These permit a higher device current or else higher switching cycle numbers.

In soft starters in three-phase networks, the three power modules are frequently loaded virtually symmetrically, so that similarly high power losses and over-temperatures are produced in the same. Differences in the power losses can arise as a result of an unequal voltage level of the three network phase voltages, which cause unequal network phase currents, and as a result of manufacturing tolerances in the let-through behavior of the power electronic components.

One solution known from the prior art resides in equipping each power module with a temperature sensor, in order thus to be able to protect each power module, independently of the others and independently of the existing power loss inequality.

A further solution resides in determining the least beneficially cooled power module by (of thermal measurement and to provide only the module with a temperature sensor. In the case of three power modules arranged beside one another and natural convection, this is the central one, since it is concomitantly heated by its two neighbors and the latter each have a cooler outer side. Given forced convection with fans, this can be each of the three power modules, depending on the direction of rotation of the rotor of the fans and the air flow direction through the power modules.

In the case of cooling with fans, should one of the outer power modules be the hottest and be fitted with the temperature sensor there, a certain temperature margin for the event of a fan defect has to be maintained, since then the central power module becomes the hottest. In addition, a temperature margin has to be incorporated in the design, in order to take the power loss inequality into account. Both result in a certain over-dimensioning of the power modules.

Another solution is the arrangement of all the power electronic components on a common heat sink, so that the latter is then provided with a single temperature sensor. However, this assumes the electrical insulation of the power components of one network phase from that of the other network phases, which is thermally disadvantageous, so that this is practicable only up to a nominal device current level of about 150-200 A.

SUMMARY

The inventors have discovered that disadvantages of the solutions known from the prior art reside in the fact that either multiple temperature sensors must be used or in design terms additional overall space for cooling elements have to be included in the planning.

Accordingly, at least one embodiment of the present invention is directed to devising a low-voltage switching device, in particular a soft starter, which, even at nominal device currents in the range up to 650 A, permits reliable temperature regulation of the power electronic components.

At least one embodiment of the invention is directed to a low-voltage switching device. Advantageous improvements and developments, which can be used on their own or in combination with one another, are the subject-matter of the claims.

According to at least one embodiment of the invention, a low-voltage switching device comprises a housing in which power electronic components are arranged in the region of ventilation of a fan. In at least one embodiment, the power electronic components operate under temperature regulation by virtue of an air flow that originates from the fan and is guided asymmetrically, so that the low-voltage switching device can be operated at a nominal device current range of up to 650 A as a result of the asymmetrically guided air flow.

At least one embodiment of the invention provides for the use of only a single fan for the cooling of all the power electronic components. Each power module is assigned a separate air channel in design terms. The cross section of the individual air channels is coordinated individually at suitable points such that with an equal power loss production, the flow through the central power module is somewhat poorer and the power module is therefore somewhat warmer than the two outer power modules, the two outer power modules being approximately equally warm.

BRIEF DESCRIPTION OF THE DRAWINGS

Further advantages and embodiments of the invention will be explained in more detail below by using an exemplary embodiment and by using the drawing, in which.

DETAILED DESCRIPTION OF THE EXAMPLE EMBODIMENTS

Figure 1:
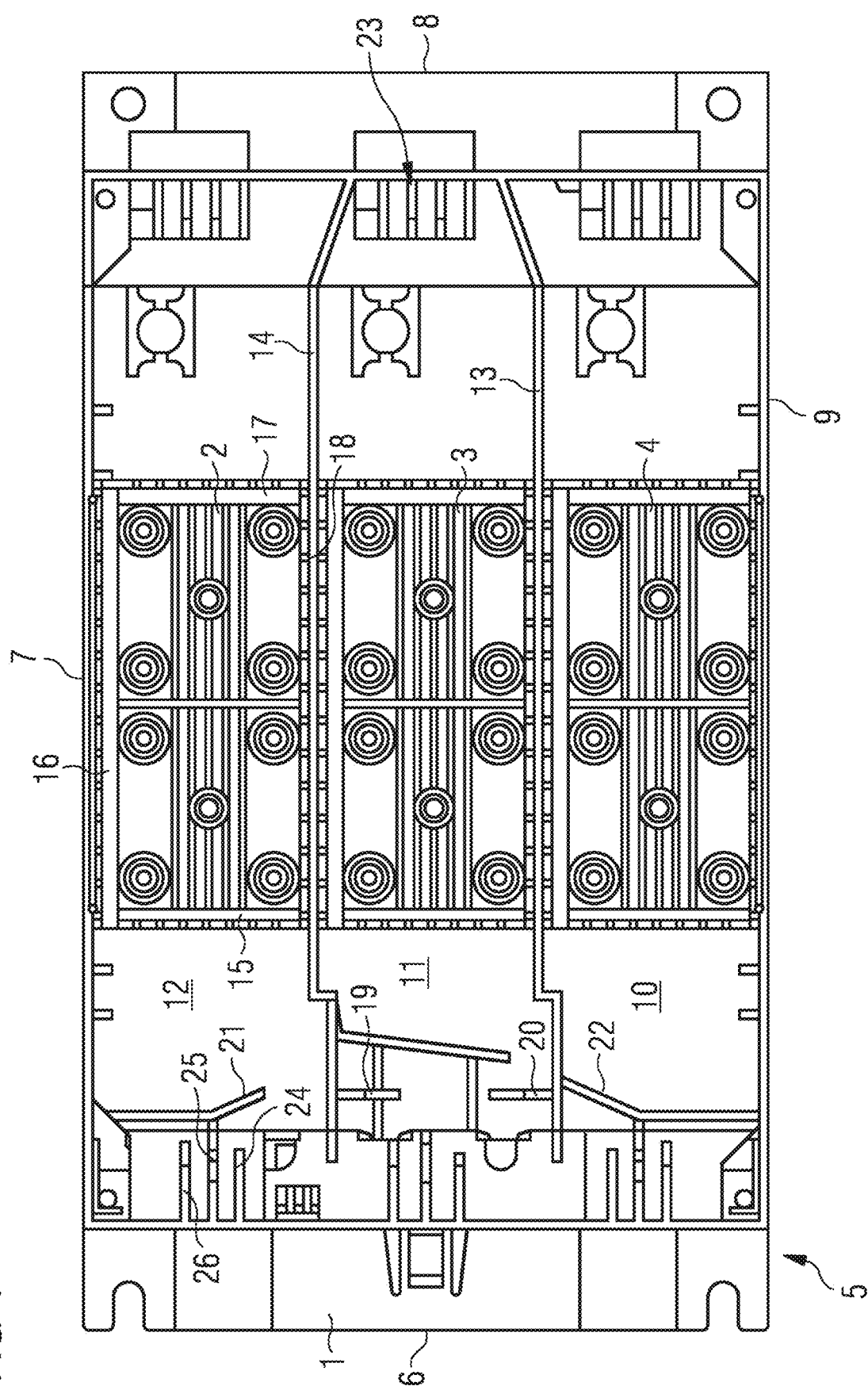
FIG. 1 shows a plan view of a device region according to the invention of a low-voltage switching device having only one fan and a defined formation of the air flow channels for the power electronic components arranged downflow.

At least one embodiment of the present invention is directed to devising a low-voltage switching device, in particular a soft starter, which, even at nominal device currents in the range up to 650 A, permits reliable temperature regulation of the power electronic components.

At least one embodiment of the invention is directed to a low-voltage switching device. Advantageous improvements and developments, which can be used on their own or in combination with one another, are the subject-matter of the claims.

According to at least one embodiment of the invention, a low-voltage switching device comprises a housing in which power electronic components are arranged in the region of ventilation of a fan. In at least one embodiment, the power electronic components operate under temperature regulation by virtue of an air flow that originates from the fan and is guided asymmetrically, so that the low-voltage switching device can be operated at a nominal device current range of up to 650 A as a result of the asymmetrically guided air flow.

At least one embodiment of the invention provides for the use of only a single fan for the cooling of all the power electronic components. Each power module is assigned a separate air channel in design terms. The cross section of the individual air channels is coordinated individually at suitable points such that with an equal power loss production, the flow through the central power module is somewhat poorer and the power module is therefore somewhat warmer than the two outer power modules, the two outer power modules being approximately equally warm.

The air channel for the central power module has a constriction at the air outlet. Further flow obstacles can be fitted in the air inlet region of this air channel, on the bottom, at the side and above the power modules. These flow channel adaptations effect the lower flow through the central channel, which is located most beneficially in flow terms.

Openings of different sizes ensure an approximately equal flow and cooling action for the two outer power modules. Here, the outer power module or the air channel located on the outside is at an advantage as a result of the direction of rotation of the fan rotor. Therefore, the air throughput in the central region is smaller than the air throughput in the outer edge region.

A temperature sensor is placed on the central, somewhat warmer, power module. The asymmetry in the air guidance is approximately set to be so high that the major part of the power loss inequalities to be expected is intercepted as a result. Therefore, even for the case in which a higher power loss is produced in the two outer power modules, it is ensured that these are no warmer than the central power module, and therefore the temperature sensor of the latter also protects the two outer power modules.

A great advantage of at least one embodiment proposed here resides in the fact that only a single fan is needed. The outlay on manufacture is considerably lower as a result, since only one fan has to be mounted and plugged onto a printed circuit board via connectors. Thus, a further connector on the printed circuit board is dispensed with. In addition, a very robust device behavior is achieved. Should the fan be impaired in its function or even fail, the central, monitored power module will become the hottest, so that the two outer power modules are automatically protected.

In addition, only a single temperature sensor is needed. Since, in most cases, the temperature sensor on the central power module has the highest temperature of all three power modules, the power modules without a temperature sensor are also protected. Two temperature sensors are saved, including the screwing onto the power module and the plugging onto the printed circuit board. Likewise, the connector on the printed circuit board and the associated electronic evaluation subassemblies are dispensed with.

In a particularly advantageous refinement of at least one embodiment of the invention, provision can be made for only one fan drawing an air flow in to be arranged in the low-voltage switching device, and a second fan to be replaced by partial air flows formed and guided asymmetrically in a defined manner.

An inventive development of at least one embodiment of this concept can reside in the power electronic components being arranged in parallel beside one another in chambers, so that the air flow originating from the fan is divided into asymmetrically guided partial air flows.

In a further specific extension of the concept according to at least one embodiment of the invention, provision can be made for each power electronic component to be assigned a separate partial air flow, wherein the cross section of the separate partial air flows is different, so that in the event of an equally formed power loss of the individual power electronic components, one power electronic component is cooled more poorly by the associated partial air flow and is thus warmer than the two other power electronic components.

It has proven to be advantageous that the warmer power electronic component is formed with an air channel for the associated partial air flow in which a flow obstacle is formed by air guide walls.

An inventive development of at least one embodiment of this concept can provide for the warmer power electronic component to be formed with an air channel for the associated partial air flow in which a flow obstacle is formed by a pedestal-like elevation on the housing bottom of the low-voltage switching device.

In addition, it corresponds to an extension of the concept according to at least one embodiment of the invention if the warmer power electronic component is formed with an air channel for the associated partial air flow in which a flow obstacle is formed via an offset of the dividing walls, formed parallel to the power electronic component, in the housing of the low-voltage switching device.

In a particularly advantageous refinement of at least one embodiment of the invention, provision can be made for the warmer power electronic component to be formed with an air channel for the associated partial air flow in which a flow obstacle is formed by a projection on the housing upper side.

An inventive extension of at least one embodiment of this concept can reside in the warmer power electronic component being arranged centrally in front of the fan, wherein the partial air flow belonging to this component is guided by mutually opposite partial walls at the start of the air channel.

In a further specific extension of the concept according to at least one embodiment of the invention, provision can be made for the power electronic components to be positioned beside the power electronic component arranged centrally in front of the fan, wherein the partial air flow belonging to these components is guided by air guide walls at the start of the air channel.

It has proven to be advantageous if the warmer power electronic component is provided with a temperature sensor.

An inventive extension of at least one embodiment of this concept can provide for the asymmetry in the air guidance through the power electronic components to be formed in such a way that the major part of the power loss inequalities to be expected is regulated as a result, so that the single temperature sensor is a control medium for all the power electronic components.

In addition, it corresponds to an extension of the concept according to at least one embodiment of the invention if the low-voltage switching device is a soft starter.

The low-voltage switching device according to at least one embodiment of the invention preferably has a box-shaped housing with a housing underside on which four side walls are arranged at an angle of 90° to one another, and which is completed by a housing upper side. The low-voltage switching device can be divided inside the housing into three housing regions, in particular a lower, central and an upper region.

Preferably, a fan, which is positioned within a side wall, can be arranged in the lower housing region. On the inside, the region after the fan in the housing is divided into preferably three chambers. This subdivision is preferably implemented by dividing walls drawn into the interior of the housing. The chambers forming as a result are formed between two mutually opposite side walls of the housing, to be specific in such a way that power electronic components positioned therein are aligned parallel to one another and in the longitudinal direction relative to the flow direction of the air channels, which are supplied with cooling air by the fan. The power electronic components are preferably formed in a box shape with four side walls, an upper side and an underside.

The central chamber is positioned directly after the fan, i.e. centrally, in the air flow direction. The other two chambers are each arranged on the mutually opposite outer side walls of the housing of the low-voltage switching device. Following the fan, partial walls in the form of air guide walls for the air flow are each arranged as a constituent part for the chambers arranged downstream. In the central chamber, preferably two mutually opposite air guide walls are formed for this purpose. Preferably, a respective air guide wall, which is formed by the respective side walls of the housing drawn inward, has been positioned for the outer chambers.

The parallel dividing walls of the central chamber are preferably formed to be offset in the air flow direction after the air guide walls, in such a way that, although they continue to extend parallel to the side walls of the housing, they are aligned closer to one of the two side walls while maintaining the distance from each other. On the opposite side to the air guide walls, these dividing walls of the central chamber are directed toward each other, preferably at an angle of about 10 to 20°.

The air guide walls of the outer chambers each define air ducts laterally beside the centrally positioned fan, which are further subdivided by air guide walls directed inward and preferably aligned parallel to one another on the side wall in which the fan is integrated, and form defined air channels.

Further flow obstacles are fitted in the air inlet region of this central air channel, on the bottom, at the side and above the power electronic components. These flow channel adaptations effect the lower flow through the central channel, which is located most beneficially in flow terms.

Openings of different sizes ensure an approximately equal flow and cooling action for the two outer power modules. Here, the outer power module or the air channel located on the outside is at an advantage, as a result of the direction of rotation of the fan rotor. Therefore, the air throughput in the central region is smaller than the air throughput in the outer edge region.

FIG. 1 shows a device region according to an embodiment of the invention of a low-voltage switching device having only one fan 1 and a defined formation of the air flow channels for power electronic components 2, 3, 4 arranged downflow.

The low-voltage switching device according to an embodiment of the invention preferably has a box-shaped housing 5 with a housing underside, on which four side walls 6, 7, 8, 9 are arranged at an angle of 90° to one another, and which is completed by a housing upper side. The low-voltage switching device can be subdivided within the housing 5 into three housing regions, in particular a lower, central and an upper region. The fan 1, which is positioned within the side wall 6, can preferably be arranged in the lower housing region.

On the inside, the region after the fan 1 in the housing 5 is divided into preferably three chambers 10, 11, 12. This division is implemented by partial walls 13, 14 drawn in in the housing interior. The chambers 10, 11, 12 formed as a result are formed between two mutually opposite side walls 7, 9 of the housing 5, specifically in such a way that power electronic components 2, 3, 4 positioned therein are aligned parallel to one another and in the longitudinal direction relative to the flow direction of the air channels, which are supplied with cooling air by the fan 1. The power electronic components 2, 3, 4 are preferably box-shaped with four side walls 15, 16, 17, 18, an upper side and a lower side.

The central chamber 11 is positioned directly after the fan 1, that is to say centrally, in the air flow direction. The other two chambers 10, 12 are each arranged on the mutually opposite outer side walls 7, 9 of the housing 5 of the low-voltage switching device. Following the fan 1, partial walls 19, 20, 21, 22 in the form of air guide walls for the air flow are each arranged as a constituent part for the chambers 10, 11, 12 arranged downstream. In the central chamber 11, preferably two mutually opposite guide walls 19, 20 are formed for this purpose. Preferably, a respective air guide wall 21, 22, which is drawn inward from the respective side walls 7, 9 of the housing, has been positioned for the outer chambers 10, 11.

The parallel dividing walls 13, 14 of the central chamber 11 are preferably formed to be offset in the air flow direction after the air guide walls, in such a way that, although they continue to extend parallel to the side walls 7, 9 of the housing 5, they are aligned closer to one of the two side walls 7, 9 while maintaining the distance from each other. On the opposite side to the air guide walls, these dividing walls 13, 14 of the central chamber 11 are directed toward each other, preferably at an angle of about 10 to 20°, so that a constriction 23 is formed.

Further flow obstacles are fitted in the air inlet region of this air channel, on the bottom, at the side and above the power modules 2, 3, 4. These flow channel adaptations effect the lower flow through the central channel 11, which is located most beneficially in flow terms.

Openings of different sizes ensure an approximately equal flow and cooling action for the two outer power electronic components 2, 4. Here, the outer power electronic component 2, 4 or the air channel located on the outside is at an advantage as a result of the direction of rotation of the fan rotor. Therefore, the air throughput in the central region is smaller than the air throughput in the outer edge region.

Figure 2:
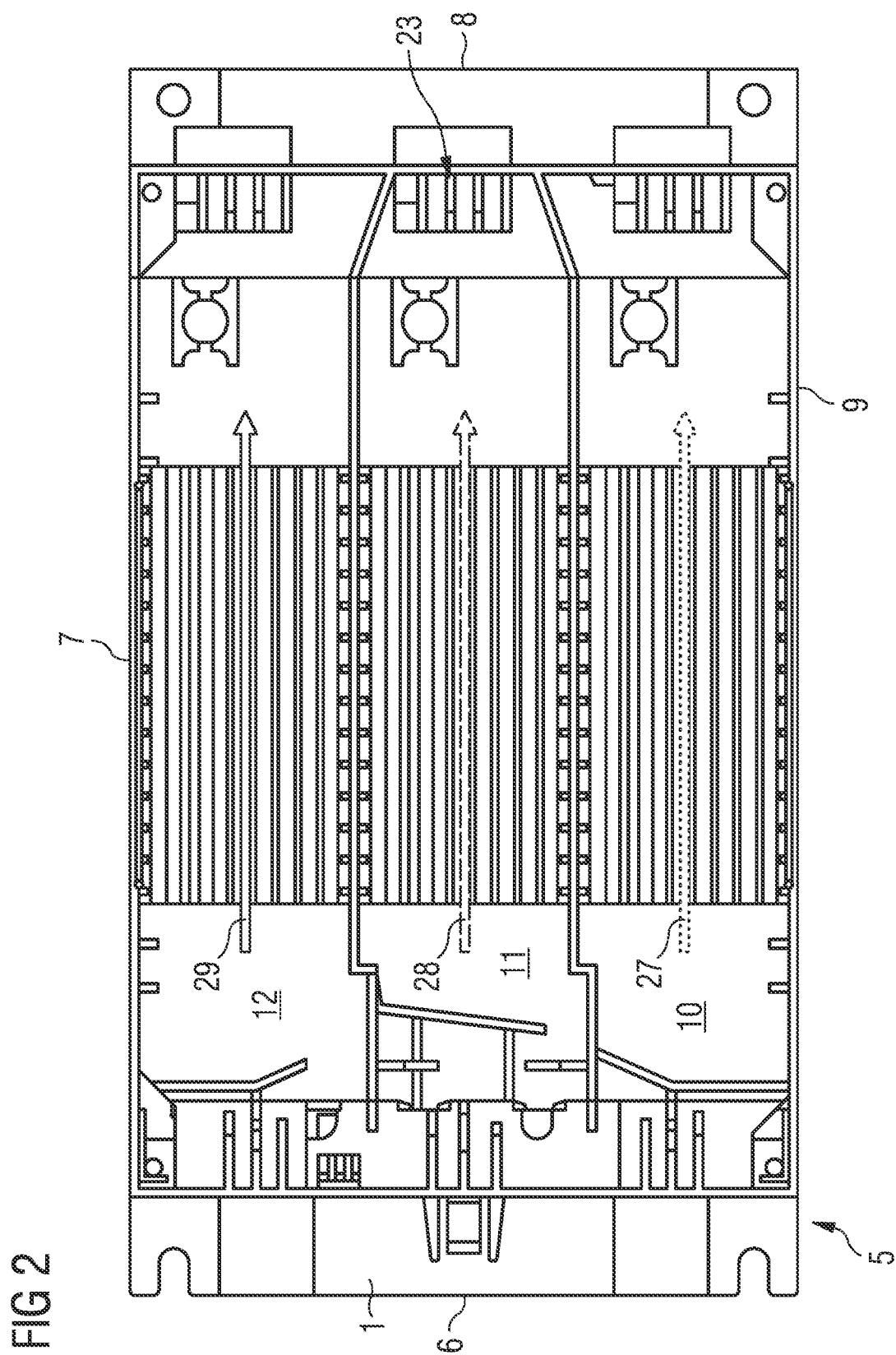
FIG. 2 shows a plan view of the illustration according to FIG. 1 without power electronic components.

In FIG. 2 the device region according to FIG. 1 is illustrated without the power electronic components 2, 3, 4. The partial air flows 27, 28, 29 illustrated in the direction of the arrow in the three chambers 10, 11, 12 are formed differently with regard to their intensity.

A temperature sensor is placed on the central, somewhat warmer, power electronic component 3. The asymmetry in the air guidance is approximately set to be so high that the major part of the power loss inequalities to be expected is intercepted as a result. Therefore, even for the case in which a higher power loss is produced in the two outer power modules 2, 4, it is ensured that these are no warmer than the central power electronic component 3, and therefore the temperature sensor of the latter also protects the two outer power electronic components 2, 4.

The great advantage of the solution proposed here resides in the fact that only a single fan 1 is needed. The outlay on manufacture is lower as a result, since only one fan 1 has to be mounted and plugged onto a printed circuit board via connectors. Thus, a further connector on the printed circuit board is dispensed with. In addition, a very robust device behavior is achieved. Should the fan 1 be impaired in its function or even fail, the central, monitored power electronic component 3 will become the hottest, so that the two outer power electronic components 2, 4 are automatically protected.

In addition, only a single temperature sensor is needed. Since, in most cases, the temperature sensor on the central power electronic component 3 has the highest temperature of all three power electronic components 2 3, 4, the power electronic components without a temperature sensor are also protected. Two temperature sensors are saved, including the screwing onto the power module and the plugging onto the printed circuit board. Likewise, the connectors on the printed circuit board and the associated electronic evaluation subassemblies are dispensed with.

The low-voltage switching device according to an embodiment of the invention is distinguished by the fact that, even with nominal device currents in the range of up to 650 A, reliable temperature regulation of the power electronic components can be implemented.

LIST OF DESIGNATIONS

1 Fan
2 Power electronic component
3 Power electronic component
4 Power electronic component
5 Housing
6 Side wall
7 Side wall
8 Side wall
9 Side wall
10 Chamber
11 Chamber
12 Chamber
13 Dividing wall
14 Dividing wall
15 Side wall
16 Side wall
17 Side wall
18 Side wall
19 Air guide wall
20 Air guide wall
21 Air guide wall
22 Air guide wall
23 Constriction
27 Partial air flow
28 Partial air flow
29 Partial air flow

The invention claimed is:

1. A low-voltage switching device, comprising: a housing, power electronic components being arranged in the housing in a region of ventilation of a fan, the power electronic components being configured to operate under temperature regulation by virtue of an air flow, originating from the fan and guided asymmetrically to create an asymmetrically guided air flow, the low-voltage switching device being configured to operate with a nominal device current range of up to 650 A as a result of the asymmetrically guided air flow, wherein each individual power electronic component, of the power electronic components, is assigned a separate partial air flow, wherein the cross section of the separate partial air flows is different, so that upon an equally formed power loss of the individual power electronic components, one power electronic component is cooled relatively more poorly by the associated partial air flow and is thus relatively warmer than the other individual power electronic components; wherein the relatively warmer power electronic component is formed with an air channel for the associated partial air flow, in which a flow obstacle is formed by air guide walls.

2. The low-voltage switching device of claim 1, wherein only one fan drawing an air flow in, is arranged in the low-voltage switching device such that partial air flows are formed and guided asymmetrically in a defined manner.

3. The low-voltage switching device of claim 1, wherein the power electronic components are arranged parallel beside one another in chambers, so that the air flow originating from the fan is divided into asymmetrically guided partial air flows.

4. The low-voltage switching device of claim 1, wherein the relatively warmer power electronic component is formed with an air channel for the associated partial air flow, in which a flow obstacle is formed by a pedestal-like elevation on a housing bottom of the low-voltage switching device.

5. The low-voltage switching device of claim 1, wherein the relatively warmer power electronic component is formed with an air channel for the associated partial air flow, in which a flow obstacle is formed by an offset of dividing walls formed parallel to the power electronic component, in the housing of the low-voltage switching device.

6. The low-voltage switching device of claim 1, wherein the relatively warmer power electronic component is formed with an air channel for the associated partial air flow in which a flow obstacle is formed by a projection on a housing upper side.

7. The low-voltage switching device of claim 1, wherein the relatively warmer power electronic component is arranged centrally in front of the fan, and wherein the partial air flow belonging to the relatively warmer power electronic component is guided by mutually opposite air guide walls at a start of the air channel.

8. The low-voltage switching device of claim 1, wherein the power electronic components are positioned beside the power electronic component arranged centrally in front of the fan, wherein the partial air flow belonging to the power electronic components positioned beside the power electronic component, is guided by an air guide wall at a start of the air channel.

9. The low-voltage switching device of claim 1, wherein the relatively warmer power electronic component is provided with a temperature sensor.

10. The low-voltage switching device of claim 9, wherein asymmetry in air guidance through the power electronic components is formed such that a major part of power loss inequalities to be expected is regulated as a result, so that the temperature sensor is a single temperature sensor acting a control medium for all of the power electronic components.

11. The low-voltage switching device of claim 1, wherein the low-voltage switching device is a soft starter.

12. The low-voltage switching device of claim 2, wherein the power electronic components are arranged parallel beside one another in chambers, so that the air flow originating from the fan is divided into asymmetrically guided partial air flows.

13. The low-voltage switching device of claim 2, wherein each individual power electronic component, of the power electronic components, is assigned a separate partial air flow, wherein a cross section of each of separate partial air flows is different, so that upon an equally formed power loss of the individual power electronic components, one power electronic component is cooled relatively more poorly by an associated partial air flow and is thus relatively warmer than other individual power electronic components.

14. The low-voltage switching device of claim 13, wherein the relatively warmer power electronic component is formed with an air channel for an associated partial air flow, in which a flow obstacle is formed by air guide walls.

15. The low-voltage switching device of claim 1, wherein the relatively warmer power electronic component is formed with an air channel for the associated partial air flow, in which a flow obstacle is formed by a pedestal-like elevation on a housing bottom of the low-voltage switching device.

16. The low-voltage switching device of claim 1, wherein the relatively warmer power electronic component is formed with an air channel for the associated partial air flow, in which a flow obstacle is formed by an offset of dividing walls formed parallel to the power electronic component, in the housing of the low-voltage switching device.

17. The low-voltage switching device of claim 1, wherein the relatively warmer power electronic component is formed with an air channel for the associated partial air flow in which a flow obstacle is formed by a projection on a housing upper side.

18. The low-voltage switching device of claim 1, wherein the relatively warmer power electronic component is arranged centrally in front of the fan, and wherein the partial air flow belonging to the relatively warmer power electronic component is guided by mutually opposite air guide walls at a start of the air channel.

19. The low-voltage switching device of claim 1, wherein the power electronic components are positioned beside the power electronic component arranged centrally in front of the fan, wherein the partial air flow belonging to the power electronic components positioned beside the power electronic component, is guided by an air guide wall at a start of the air channel.

20. The low-voltage switching device of claim 1, wherein the relatively warmer power electronic component is provided with a temperature sensor.

21. The low-voltage switching device of claim 20, wherein asymmetry in air guidance through the power electronic components is formed such that a major part of power loss inequalities to be expected is regulated as a result, so that the temperature sensor is a single temperature sensor acting a control medium for all of the power electronic components.

22. The low-voltage switching device of claim 2, wherein the low-voltage switching device is a soft starter.

\* \* \* \* \*